US00RE44384E

(19) United States
(12) Reissued Patent
Hirano et al.

(10) Patent Number: US RE44,384 E
(45) Date of Reissued Patent: Jul. 23, 2013

(54) METHOD AND DEVICE FOR MOUNTING ELECTRONIC COMPONENT

(75) Inventors: Masato Hirano, Osaka (JP); Yoshinori Sakai, Osaka (JP); Tateo Nakashima, Kyoto (JP)

(73) Assignee: Panasonic Corporation, Osaka (JP)

(21) Appl. No.: 11/388,168

(22) Filed: Mar. 22, 2006

Related U.S. Patent Documents

Reissue of:
(64) Patent No.: 6,708,402
Issued: Mar. 23, 2004
Appl. No.: 09/809,488
Filed: Mar. 15, 2001

U.S. Applications:
(62) Division of application No. 09/109,352, filed on Jul. 2, 1998, now Pat. No. 6,230,393.

(30) Foreign Application Priority Data

Jul. 7, 1997 (JP) ..... P9-181261
Dec. 22, 1997 (JP) ..... P9-353293

(51) Int. Cl.
*H05K 3/30* (2006.01)
*B23P 19/00* (2006.01)

(52) U.S. Cl.
USPC ..... 29/833; 29/832; 29/834; 29/740; 29/743

(58) Field of Classification Search
USPC ..... 29/832–836, 739–743, 759, 705–710, 29/719–722
See application file for complete search history.

(56) References Cited

U.S. PATENT DOCUMENTS

| | | | | |
|---|---|---|---|---|
| 4,494,902 | A * | 1/1985 | Kuppens et al. | 221/74 |
| 4,615,093 | A * | 10/1986 | Tews et al. | 29/407 X |
| 4,631,816 | A * | 12/1986 | Fujita et al. | 29/740 |
| 4,768,647 | A * | 9/1988 | Lehtola | 198/760 |
| 4,827,436 | A * | 5/1989 | Sabersky et al. | 364/559 X |
| 4,858,308 | A * | 8/1989 | Komori | 29/740 |
| 4,880,106 | A * | 11/1989 | Falconer et al. | 198/763 |
| 4,952,109 | A * | 8/1990 | Hendricks | 29/741 |
| 4,969,256 | A * | 11/1990 | Shimizu et al. | 29/834 X |
| 4,995,157 | A * | 2/1991 | Hall | 29/740 |
| 4,999,909 | A * | 3/1991 | Eguchi et al. | 29/740 |
| 5,033,185 | A * | 7/1991 | Hidese | 29/740 |
| 5,060,366 | A * | 10/1991 | Asai et al. | 29/739 |
| RE33,780 | E * | 12/1991 | Itagaki et al. | 29/741 |

(Continued)

FOREIGN PATENT DOCUMENTS

| | | |
|---|---|---|
| JP | 2-191400 | 7/1990 |
| JP | 4-49405 | 2/1992 |

(Continued)

*Primary Examiner* — Minh Trinh
(74) *Attorney, Agent, or Firm* — Jordan and Hamburg LLP

(57) ABSTRACT

In a component mounting device in which a component is picked up and mounted on a circuit board by a suction nozzle, an amount of displacement between a center position of the suction nozzle 11 and that of the picked-up component 12 is measured, and when it is larger than a preliminarily determined value, a warning is generated indicating that the parts cassette 3 from which the component 12 has been fed is in abnormal condition, as well as the mounting action of the component 12 is stopped.

19 Claims, 4 Drawing Sheets

U.S. PATENT DOCUMENTS 5,070,598 A * 12/1991 Itagaki et al. ..... 29/705
5,086,556 A * 2/1992 Toi ..... 29/740 X
5,145,099 A * 9/1992 Wood et al. ..... 228/9 X
5,208,969 A * 5/1993 Hidese ..... 29/740
5,278,634 A * 1/1994 Skunes et al. ..... 356/400
5,329,692 A * 7/1994 Kashiwagi ..... 29/740
5,337,465 A * 8/1994 Tamaki et al. ..... 29/740
5,384,956 A * 1/1995 Sakurai et al. ..... 29/834 X
5,457,874 A * 10/1995 Konezawa et al. ..... 29/743
5,498,942 A * 3/1996 Ijuin ..... 318/567 X
5,539,977 A * 7/1996 Kano et al. ..... 29/833
5,568,264 A * 10/1996 Nakatsuka et al. ..... 356/394 X
5,570,993 A * 11/1996 Onodera et al. ..... 414/783 X
5,588,195 A * 12/1996 Asai et al. ..... 29/33 M
5,605,430 A * 2/1997 Legrady ..... 414/412
5,607,097 A * 3/1997 Sato et al. ..... 228/8 X
5,608,642 A * 3/1997 Onodera ..... 364/478.01 X
5,639,009 A * 6/1997 Abe ..... 228/102 X
5,651,176 A * 7/1997 Ma et al. ..... 29/740
5,660,519 A * 8/1997 Ohta et al. ..... 414/783 X
5,671,527 A * 9/1997 Asai et al. ..... 29/740
5,727,311 A * 3/1998 Ida et al. ..... 29/832
5,741,114 A * 4/1998 Onodera ..... 414/783 X
5,743,005 A * 4/1998 Nakao et al. ..... 29/833
5,768,759 A * 6/1998 Hudson ..... 29/407.04 X
5,768,765 A * 6/1998 Fujioka et al. ..... 29/740 X
5,778,524 A * 7/1998 Stridsberg ..... 29/836
5,855,059 A * 1/1999 Togami et al. ..... 29/740
5,858,806 A * 1/1999 Nishida ..... 438/7 X
5,864,944 A * 2/1999 Kashiwagi et al. ..... 29/833
5,867,897 A * 2/1999 Mimura et al. ..... 29/840
5,884,831 A * 3/1999 Sato et al. ..... 228/6.2 X
5,924,192 A * 7/1999 Wuyts ..... 29/833 X
6,056,109 A * 5/2000 Hidai et al. ..... 198/431 X
6,088,911 A * 7/2000 Isogai et al. ..... 29/740 X
6,230,393 B1 * 5/2001 Hirano et al. ..... 29/740 X
6,493,931 B2 * 12/2002 Hirano et al. ..... 29/832

FOREIGN PATENT DOCUMENTS

JP 4-162500 6/1992
JP 6-244598 9/1994
JP 7-79096 3/1995
JP 9-186493 7/1997

* cited by examiner

METHOD AND DEVICE FOR MOUNTING ELECTRONIC COMPONENT

Matter enclosed in heavy brackets [ ] appears in the original patent but forms no part of this reissue specification; matter printed in italics indicates the additions made by reissue.

This is a division of application Ser. No. 09/109,352, filed Jul. 2, 1998 now U.S. Pat. No. 6,230,393.

BACKGROUND OF THE INVENTION

1. Field of the Invention

The present invention relates to a component mounting method and device which are used in a component mounting apparatus for mounting an electronic component on an electrode in a process of mounting operation in which a paste of cream solder is applied on an electrode on a circuit board, on which an electronic component which is positioned above the electrode is mounted, after which the cream solder is heated and melted to join the component onto the electrode.

2. Description of the Related Art

FIG. 4 is a plan view typically showing a primary structure of a component mounting device, in which a plurality of parts cassettes 42 in a component feeding unit 43, respectively accommodating different types of electronic components, are moved to a position where the component is picked up by a suction nozzle unit 41 in the order of mounting onto the circuit substrate 44.

The suction nozzle unit 41 has a rotary structure, which is constructed such that a plurality of suction nozzles 40 mounted thereon are successively moved on a circular track for picking up an electronic component from the parts cassette 42 in the component feeding unit 43 and mounting it onto the circuit substrate 44 which has been loaded to a mounting position. The suction nozzle unit 41 rotates to successively transfer each of the suction nozzles 40 from the positions denoted at encircled numerals 1 to 10 in a clockwise direction as shown in the figure. The electronic component is picked up from the parts cassette 42 at a component pick-up position (component pick-up point) denoted at encircled numeral 5, the picked-up posture of the component is recognized with image recognition process using a camera at a posture recognizing position (component recognizing point) denoted at encircled numeral 7, and the posture of the component is corrected around the axis of the suction nozzle 40 by its rotation based on the recognition results of the picked-up posture of the component at a posture correcting position (component position adjusting point) denoted at encircled numeral 9.

Meanwhile, the circuit substrate 44 is supported on an X-Y table (not shown) for free movements in X- and Y-directions, so as to bring a predetermined position of the circuit substrate 44 on which an electronic component is to be mounted is brought under a component mounting position (component mounting point) denoted at encircled numeral 10 of the suction nozzle unit 41. The circuit substrate 44 is also moved in directions for correcting displacement of the component in X- and Y-directions based on the picked-up posture recognition results. It is thus possible to mount an electronic component 45 picked up by the suction nozzle 40 which is displaced as shown in FIG. 5 precisely on the predetermined position on the circuit substrate 44.

However, in high density chip mounting of recent years, the space between two adjacent components have become smaller and smaller. As a result, especially in the case where the outer dimensions of the component are smaller than those of the suction nozzle, and under a condition that the center of the suction nozzle and that of the component are not in register with each other, it is often the case that the suction nozzle and an electronic component which has previously mounted on the circuit board interfere with each other, thus causing mounting errors. As shown in FIG. 6, for example, when mounting the electronic component 45 picked up by the suction nozzle 40 next to the electronic component 46 which has already been mounted on the circuit substrate 44, if the electronic component 45 held with the suction nozzle 40 is displaced from a prescribed position of the nozzle, the suction nozzle 40 which is lowered so as to mount the electronic component 45 to a predetermined position will hit the electronic component 46 previously mounted, which may cause the component 46 to be tilted or sprung out.

Also, the electronic component mounting device has an automatic recovery function in the case of failing to mount a component due to errors in picking up action, which is implemented such that the component which the nozzle failed to mount is mounted after all the other components have been mounted. In such a case, since the mounting order is different from the normal one, the component has to be mounted between the other components which have already been mounted, wherefore if the position of the component held by the suction nozzle is displaced, it is more often the case that the suction nozzle and the previously mounted component interfere with each other, causing frequent errors in mounting operation of the components onto the circuit substrate 44. In particular, it may cause a serious problem if the height of the component which has already been mounted is larger than that of the component which is going to be mounted later.

SUMMARY OF THE INVENTION

In view of the foregoing, an object of the present invention is to provide a component mounting device and method, by which, when mounting components onto a circuit substrate, the quality of mounted conditions of the components is kept favorable without causing any interference between the previously mounted component and the nozzle, even when the center of the nozzle and that of the component are not correspondent to each other.

In order to achieve the above object, the component mounting device of the present invention comprises a means for measuring an amount of displacement between a center position of a component suction nozzle and a center position of the component held by the component suction nozzle with respect to each of the components fed from all parts cassettes set in a component feeding unit during the component mounting device is in operation, informing that a particular parts cassette from which the component has been fed is in abnormal condition when the amount of displacement is larger than a predetermined value, and for stopping the action of mounting the component.

With this arrangement, under a certain abnormal circumstance while the device is in operation, it is informed to an operator that abnormality has been occurred as well as the mounting action is stopped, thereby preventing interference between the component suction nozzle and the component, and enabling the operator to investigate and confirm the causes of the abnormality.

Further, the device comprises a means which measures an amount of displacement between a center position of a component suction nozzle and a center position of a component held by the component suction nozzle, and detects and informs that a particular component suction nozzle or parts cassette from which the component has been fed is in abnormal condition based on resultant data of measurement, wherein the component is respectively picked up by the component suction nozzle from all of the parts cassettes set in a component feeding unit and measurement of the displacement amount of the component is effected in a preparatory step before commencement of actual production.

By this means, defective nozzles or parts cassettes are identified prior to actual production, by which mounting errors when mounting the component onto the circuit substrate can be avoided.

Also, in order to achieve the above object, the component mounting method of the present invention comprises the steps of: measuring an amount of displacement of the component with respect to the component suction nozzle; and adjusting the component pick-up position of the parts cassette which requires position adjustment based on resultant data of measurement.

More specifically, the method comprises the steps of: obtaining data on an amount of displacement of the component from a prescribed holding position of the component suction nozzle corresponding to each of the parts cassettes based on posture recognition results detected at the posture recognizing position; and adjusting a feeding position of the electronic component to the component pick-up position based on this displacement amount data.

According to the above described component mounting method, from the data on the posture of the component held by the component suction nozzle with respect to all the electronic components detected at the posture recognizing position, the data on displacement amount of the component per each parts cassettes can be obtained, wherefore the tendency of displacement in the component feeding position with respect to the pick-up position of the suction nozzle can be recognized. Specifically, if it is found that all of the electronic components are displaced in the same direction, it is determined that the position of the component feeding unit or the parts cassettes in its entirety is inappropriate in relation to the component pick-up position, whereas if it is found that only a specific type of electronic components are always picked up in a displaced position, it is determined that the feeding position of the parts cassette which feeds this type of electronic component is inappropriate. Accordingly, by adjusting the component feeding position to the component pick-up position in a direction for correcting displacement based on the displacement tendency obtained from displacement data, it is possible to pick up the component precisely in a predetermined position of the component suction nozzle, whereby it is possible to mount electronic components accurately on the circuit substrate with high mounting density.

If it is detected from the displacement amount data that all of the electronic components are picked up in a displaced position in the same direction, such displacement can be corrected by adjusting the position of the component feeding unit or the loading position of the parts cassettes on the component feeding unit in a direction for correcting the displacement. Also, if it is detected from the displacement amount data that one specific type of electronic component is picked up in a displaced position, such displacement can be corrected by adjusting the component feeding position to the component pick-up position from the parts cassette which feeds this type of component.

Also, in order to achieve the above object, the device for mounting an electronic component in which a plurality of parts cassettes respectively accommodating different types of electronic components are moved by a component feeding unit to a component pick-up position in a mounting order for feeding electronic components, and a plurality of component suction nozzles are successively moved along a circular track from the component pick-up position, where the component suction nozzle picks up the electronic component, to a posture recognizing position, where the posture of the electronic component held with the component suction nozzle is detected, based on which the position and angle of the electronic component in relation to a predetermined position on a circuit substrate are corrected, and further to a component mounting position, where the picked-up electronic component is mounted on the predetermined position on the circuit substrate, according to the present invention, comprises: a displacement amount data processing means for obtaining data on an amount of displacement of the electronic component from a prescribed holding position of the suction nozzle corresponding to each of the parts cassettes based on posture recognition results detected at the posture recognizing position, and a drive means for moving the component feeding unit or the parts cassette so as to adjust the component feeding position to the component pick-up position in a direction for correcting the amount of displacement of the electronic component which is obtained from the displacement amount data.

With the above described structure, from the data on the posture of the component held by the nozzle with respect to all the electronic components detected at the posture recognizing position, the data on displacement amount of the component per each parts cassettes can be obtained by means of the displacement data processing means, wherefore the tendency of displacement in the component feeding position with respect to the pick-up position of the component suction nozzle can be recognized. Specifically, if it is found that all of the electronic components are displaced in the same direction, it is determined that the position of the component feeding unit or the parts cassettes in its entirety is inappropriate in relation to the component pick-up position, whereupon the component feeding unit or the entire group of parts cassettes is moved in a direction for correcting the displacement based on the obtained amount of displacement. Also, if it is found that only a specific type of electronic components are always picked up in a displaced position, it is determined that the feeding position of the parts cassette which feeds this type of electronic component is inappropriate, whereupon the feeding position of the parts cassette which feeds the component is adjusted.

DESCRIPTION OF THE PREFERRED EMBODIMENTS

Preferred embodiments of the present invention will be described below with reference to the accompanying drawings for better understanding of the present invention.

Figure 1:
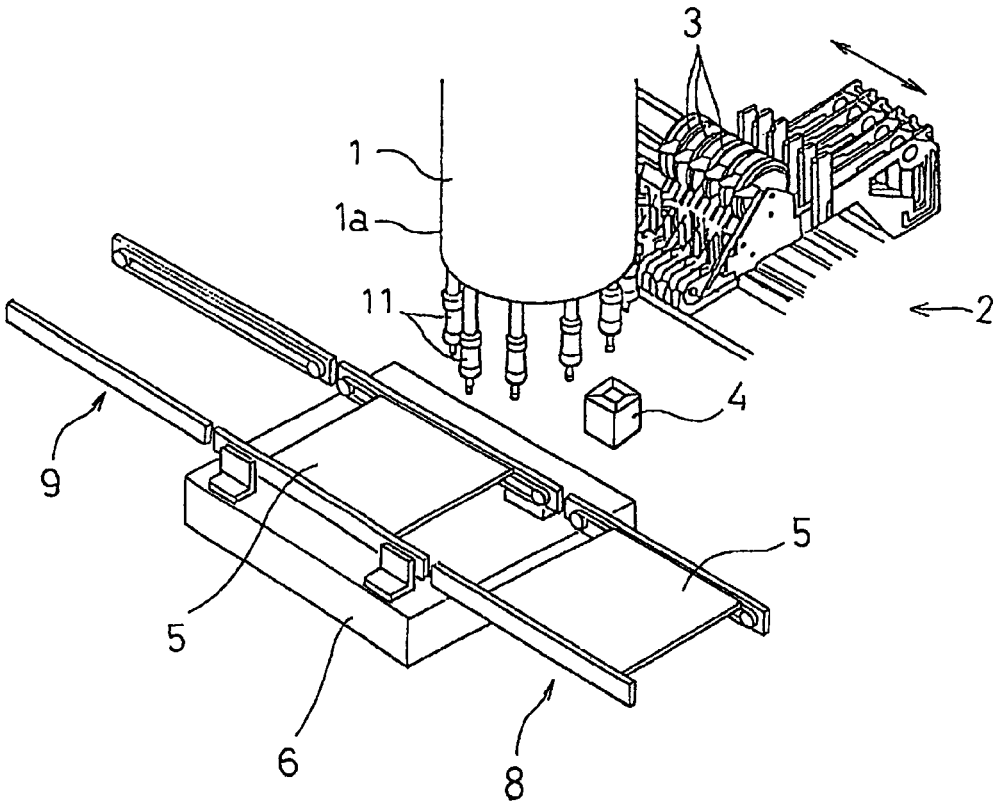
FIG. 1 is a perspective view showing an essential structure of a component mounting device according to one embodiment of the present invention.

FIG. 1 shows a main structure of the component mounting device according to one embodiment of the present invention. The device comprises a suction nozzle unit 1 with a plurality of suction nozzles 11 (component suction nozzle) which are successively moved around on a circular track, a component feeding unit 2 with a multiplicity of parts cassettes 3, a recognition camera 4 for recognizing the picked-up posture of the electronic component held by the suction nozzle 11, and an X-Y table 6 for supporting and transferring a circuit substrate 5 loaded from a loader 8 such as to bring a mounting position of the electronic component toward just below the suction nozzle 11.

Figure 2:
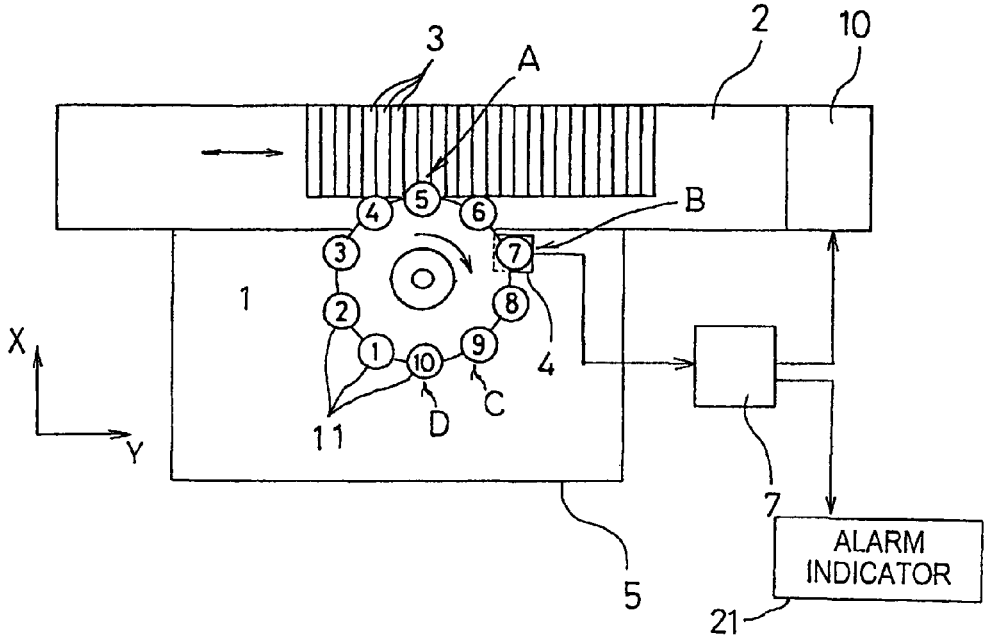
FIG. 2 is a plan view typically showing a positional relationship of the component mounting device of FIG. 1.

FIG. 2 is a plan view typically showing the disposition of the above described structure. The suction nozzle unit 1 has a rotary structure in which ten suction nozzles 11 attached on its head 1a are moved in a direction shown by the arrow in the figure with a fixed step on a circle. Each moved position is denoted at encircled numerals 1 to 10. The component feeding unit 2 carries and transfers the plurality of parts cassettes 3 in the Y-axis direction as shown, in such a way that the parts cassette 3 accommodating the desired type of components is brought to a component feeding position which is under the component pick-up position A (moved position denoted at encircled numeral 5) of the suction nozzle unit 1 in the order of mounting onto the circuit substrate 5. The suction nozzle unit 1 picks up by suction an electronic component from the parts cassette 3 which has been transferred to the component feeding position with the suction nozzle 11 located at the component pick-up position A. The suction nozzle 11 which has picked up the electronic component is moved by rotation to the posture recognizing position B (moved position denoted at encircled numeral 7) above the recognizing camera 4, where the attitude of the electronic component held by the nozzle is recognized. Based on the data obtained by this image recognition using the camera 4, the suction nozzle 11 corrects the displacement of the component in a rotating direction by rotating movement at the posture correcting position C (moved position denoted at encircled numeral 9).

Meanwhile, as shown in FIG. 1, the circuit substrate 5 is loaded from the loader 8 onto the X-Y table 6, and moved with free movements in the X- and Y-directions of the X-Y table 6 such that the mounting position of the electronic component is brought under the component mounting position D (moved position denoted at encircled numeral 10) of the suction nozzle unit 1. Also, the displacement in the position of the electronic component held by the nozzle in X- and Y-directions is corrected with mounting position correcting action of the X-Y table 6 with its movements in X- and Y-directions. Accordingly, even in the case where the center of the nozzle and that of the component are not in register with each other, the displacement in rotating direction is corrected with the rotation of the suction nozzle 11, and the displacement in X- and Y-directions is corrected by the movements of the X-Y table 6, whereby the suction nozzle 11 which has moved to the component mounting position D is able to mount the electronic component 5 onto a predetermined mounting position by being lowered. These actions are repeated until all the necessary electronic components are mounted on the circuit substrate 5, after which the substrate 5 is carried away by an unloader 9 to the outside of the apparatus.

It is possible to carry out accurate mounting operation thanks to the position correcting actions as described above, even in the case where the electronic component is held with the suction nozzle 11 in a displaced posture. However, in a circuit substrate 5 with high mounting density as previously shown in FIG. 6, there still remains a risk that the suction nozzle 11 will touch a previously mounted electronic component, if the center positions of the suction nozzle 11 and the electronic component are not in register with each other. Also, if there are any components which the nozzle failed to mount on the circuit substrate 5 due to failure in picking up action, the device performs its automatic recovery action for mounting the component which has not been mounted after the completion of mounting operation of all the other components. In such case, the component has to be mounted between adjacent components which have previously been mounted or next to a component of greater height, wherefore it is necessary to pick up the electronic component at a predetermined position of the suction nozzle 11. Furthermore, if the electronic component is held in an appropriate position of the suction nozzle 11, the X-Y table 6 needs to move correspondingly less for correction of the displacement, whereby it is possible to enhance production efficiency.

Figure 3:
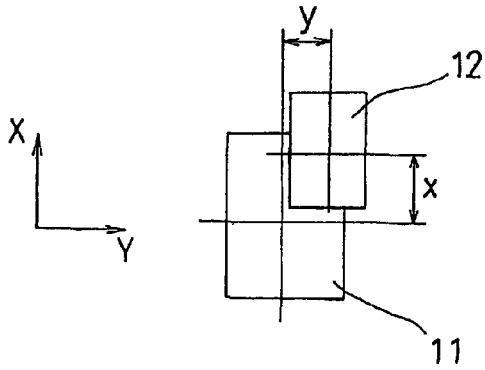
FIG. 3 is a typical view showing a component picked up by a component suction nozzle in a displaced state.
Figure 4:
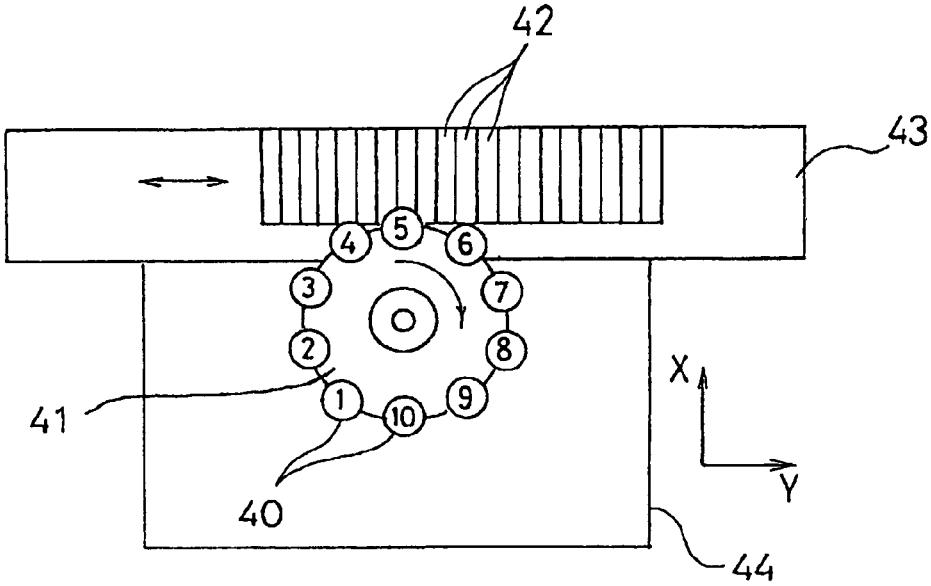
Fig. 4 Prior Art
FIG. 4 is a typical view showing an essential structure of a conventional electronic component mounting apparatus.
Figure 5:
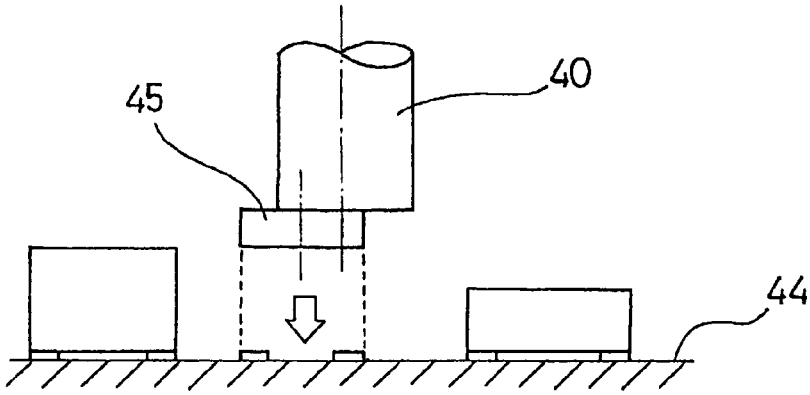
FIG. 5 is a diagram for explaining a state of component which is being mounted to a mounting position on the circuit substrate.

Therefore, in the component mounting device of the present invention, there is provided a means for adjusting the pick-up position of the electronic component by the suction nozzle 11. The amount of displacement of the electronic component from a predetermined position of the suction nozzle 11 can be recognized by image recognition using the posture recognition camera 4 disposed under the posture recognizing position B, which is then inputted in a displacement detecting section (displacement amount data processing means) 7. As shown in FIG. 3, the amount of displacement x in the X-axis direction and the amount of displacement y in the Y-axis direction are measured with respect to the center of the suction nozzle 11 and that of the electronic component 12, and resultant data are stored in this displacement detecting section 7 for each type of electronic components. Since various different types of components are accommodated in respective parts cassettes 3, by storing data on displacement amount for each type of electronic components, displacement of the component feeding position with respect to the component pick-up position A per each parts cassette 3 can be detected. In addition to the data on displacement in X- and Y-directions, it is even more preferable if an amount of displacement of the component 12 in a rotating direction is also detected, and resultant data are stored.

Displacement of the electronic component from a predetermined position of the suction nozzle 11 is caused sporadically when being picked up by the nozzle 11. On the other hand, if the position of the suction nozzle 11 at the component pick-up position A and the position of the parts cassettes 3 are not correspondent to each other, it is also the cause of displacement of the component. Consequently, data can be obtained as to whether the displacement is found only in one specific type of electronic component or in all types of the electronic component by storing data of displacement amount for each of the different types of electronic components.

If displacement is found only in a specific type of electronic components, it can be determined that the component feeding position of the parts cassette 3 which feeds this type of component is inappropriate. Accordingly, adjustment is made so that components are accurately fed to the component feeding position A from the parts cassette 3 in question. Also, if it is found that all of the electronic components are picked up in a displaced posture, it can be determined that the disposition of the component feeding unit 2 or the loading position of the entire group of the parts cassettes 3 on the component feeding unit 2 is displaced, and adjustment is made accordingly.

Such adjustment can be accomplished manually at the time when it is detected at the displacement detecting section 7 that the amount of displacement is beyond a permissible range, but it is also possible to construct such that the component feeding unit 2 is provided with a drive mechanism 10 (drive means) as shown in FIG. 2 for slightly moving the component feeding unit 2 in X- and Y-directions by driving signals outputted from the displacement detecting section 7 which command directions for correcting the displacement. It is similarly effective if it is constructed such that the loading position of the parts cassettes 3 is moved for such displacement correction.

It is also possible to provide each of the parts cassettes 3 with a mechanism for moving in a minute amount in the X-axis direction and to construct such that the movement of each parts cassette 3 (in the Y-axis direction) imparted by the component feeding unit 2 toward the component feeding position A is adjusted based on the amount of displacement, whereby displacement of a specific electronic component can be also corrected.

The component mounting device of the above described construction is constituted such that in case the amount of displacement of the component is larger than a prescribed value, it is informed that the parts cassette 3 from which the component being held by the suction nozzle 11 is in abnormal condition, and the action of mounting that component is stopped. Such mounting action is performed as will be described below.

At the component pick-up position A, the component loaded on the parts cassette 3 is picked up by the suction nozzle 11 and is transferred to the next position or the posture recognizing position B with the rotation of the head 1a of the suction nozzle unit 1. At the posture recognizing position B where the electrode or the shape of the picked-up component is recognized, an amount of displacement between a central position of the nozzle and that of the component is measured and the data is saved in a displacement detecting section (data measurement/process unit) 7. The displacement detecting section 7 controls the device to pause so that the component 12 currently held by the suction nozzle 11 is not to be mounted, or pauses the device and simultaneously generates a warning sign, in order to prevent interference between a component 12a which has previously been mounted and the suction nozzle 11, when the measured amount of displacement p, i.e., the difference q between the outer edge of the component 12 and that of the suction nozzle 11, is equal to or larger than the space r between two adjacent components ($q \geqq r$). At the same time, a warning sign indicating abnormality of the parts cassette 3 from which the currently held component 12 has been fed is generated.

An alarm indicator 21 shown in FIG. 2 is constructed such that in case the displacement amount of the picked-up component 12 is such as would cause interference between a previously mounted component 12a and the component suction nozzle 11, an alarm indicating portion is illuminated or lighted on and off on receiving information from the displacement detecting section (data measurement/processing unit) 7, and that information (for example, numerals identifying each parts cassette) which specifies the parts cassette 3 from which the component 12 currently held by the component suction nozzle 11 has been fed is displayed. Such warning sign may be also generated by a sound effect. It is also possible to construct such that a warning lamp is individually provided to each of the parts cassettes 3, and when one of the parts cassettes 3 is detected to be in abnormal condition, the warning lamp of the abnormal parts cassette 3 is illuminated.

Figure 7:
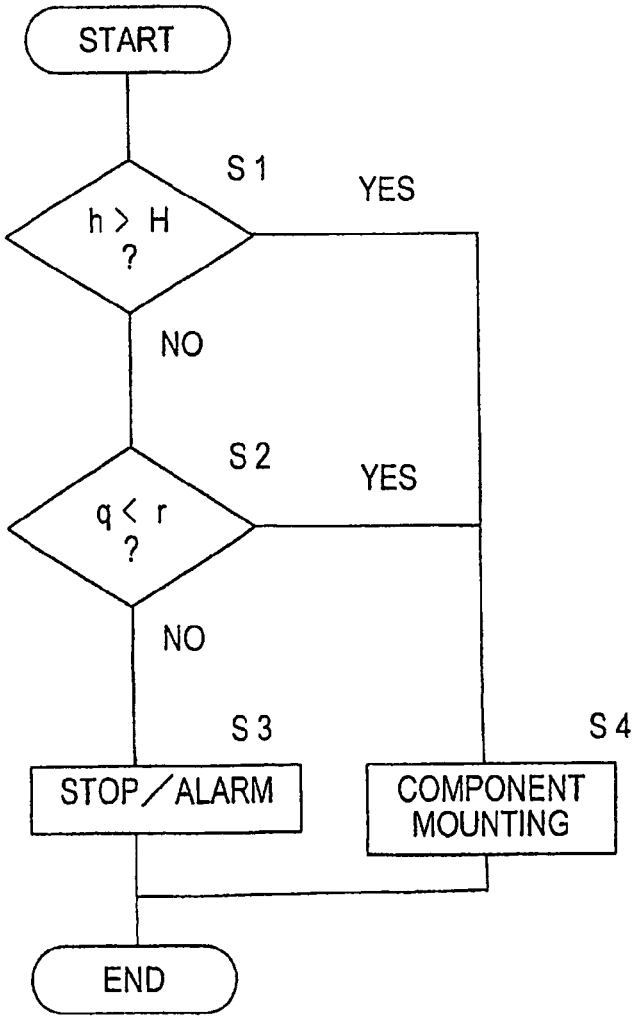
FIG. 7 is a flow chart showing an example of control of the device in one embodiment of the present invention.

FIG. 7 is a control flow chart of a control unit (not shown) for determining whether the component mounting operation should be performed or stopped based on the amount of displacement in position of the component detected by the displacement detecting section (data measurement/processing unit) 7 and the information on the shape and height of each type of electronic component which is previously stored.

Figure 6:
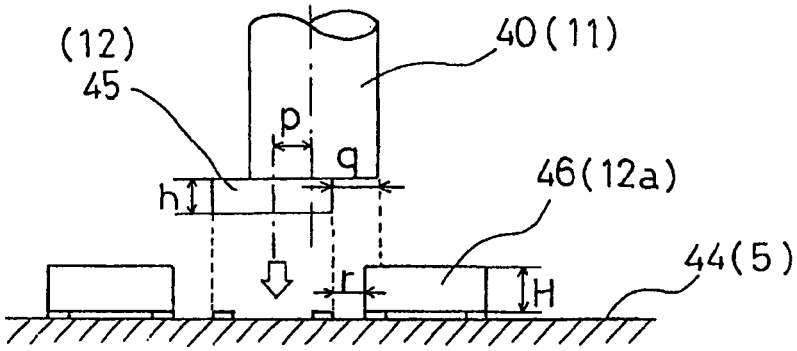
FIG. 6 is a diagram for explaining a state of component which is being mounted to a mounting position on the circuit substrate with high mounting density.

First, at step S1, it is determined whether the height h of the component 12 which is going to be mounted is larger than the height H of the adjacent component 12a which has previously been mounted (see FIG. 6). If h is more than H ($h>H$), the procedure goes on to step S4 and the component mounting operation is performed, since there is no risk that the component suction nozzle 11 and the component 12a interfere with each other. If H is equal to or greater than h ($h \leqq H$), the procedure proceeds to step S2, where it is determined whether the distance q between the outer edge of the component 12 which is going to be mounted and the outer edge of the component suction nozzle 11 is smaller than the space r between adjacent components. If q is smaller than r ($q<r$), the procedure goes on to step S4 and the component mounting operation is performed, since there is no risk that the component suction nozzle 11 and the component 12a interfere with each other. If q is equal to or larger than r ($q \geqq r$), the component suction nozzle 11 and the previously mounted component 12a will interfere with each other, so the procedure proceeds to step S3 where the component mounting operation is stopped and a warning sign is generated.

Although the above embodiment has been described in relation to a case in which the apparatus is in operation, various modifications are of course possible. For example, in a preparation step prior to actual manufacturing operation, components accommodated in the parts cassettes which are installed in a component feeding unit may be picked up from all of the parts cassettes with suction nozzles and the measurement with respect to center positions of the nozzles and the components may be made, so that abnormality of each nozzle and parts cassette can be detected based on that data. In such a case, if there are defective nozzles or parts cassettes, they can be identified prior to actual production, whereby mounting errors can be prevented.

Also, although the above described embodiment has been described in relation to a component mounting device of rotary structure provided with a suction nozzle unit, the present invention is not limited to this and may be also adopted to a device of another type in which, for example, the suction nozzle moves in X- and Y-directions. Furthermore, the parts cassettes as have been described in the above embodiment are not limited to a tape-like component assembly but may be, for example, a stocker type component feeder.

While a preferred embodiment of the invention has been described using specific terms, such description is for illustrative purposes only, and it is to be understood that changes and variations may be made without departing from the spirit or scope of the following claims.

What is claimed is:

1. A method of mounting an electronic component in which a plurality of parts cassettes respectively accommodating different types of electronic components are moved by a component feeding unit to a component feeding position in a mounting order for feeding electronic components, and a plurality of component suction nozzles are successively moved along a circular track from a component pick-up position above the component feeding position, where the component suction nozzle picks up the electronic component, to a posture recognizing position, where the posture of the electronic component held with the component suction nozzle is detected, and further to a component mounting position, where the picked-up electronic component is mounted on a circuit substrate, comprising:

obtaining data on an amount of displacement of the component from a prescribed holding position of the component suction nozzle corresponding to each of the parts cassettes based on posture recognition results *corresponding to X- and Y-axes* detected at the posture recognizing position; and adjusting the component feeding position of a subsequently-fed electronic component *by moving the component suction nozzle in at least one of X- and Y-directions defined by the X- and Y-axes, respectively,* to more accurately correspond to the component pick-up position based on said data on the amount of displacement.

2. The method of mounting an electronic component according to claim 1, wherein at least one of a position of the component feeding unit and a placing position of the parts cassettes onto the component feeding unit is adjusted based on said data on the amount of displacement.

3. The method of mounting an electronic component according to claim 1, wherein the component feeding position from each of the parts cassettes toward the component pick-up position is adjusted based on the displacement amount data.

[4. A device for mounting an electronic component in which a plurality of parts cassettes respectively accommodating different types of electronic components are moved by a component feeding unit to a component feeding position in a mounting order for feeding electronic components, and a plurality of component suction nozzles are successively moved along a circular track from a component pick-up position above the component feeding position, where the component suction nozzle picks up the electronic component, to a posture recognizing position, where the posture of the electronic component held with the component suction nozzle is detected, and further to a component mounting position, where the picked-up electronic component is mounted on a circuit substrate, comprising:

displacement amount data processing means for obtaining data on an amount of displacement of the electronic component from a prescribed holding position of the suction nozzle corresponding to each of the parts cassettes based on posture recognition results detected at the posture recognizing position, and drive means for moving at least one of the component feeding unit and the parts cassette in a direction to adjust the component feeding position to more accurately correspond to the component pick-up position for correcting the amount of displacement of the electronic component which is obtained from the displacement amount data for a subsequently-fed electronic component.]

5. A method of mounting an electronic component on a circuit substrate, comprising:

providing component suction nozzles successively movable along a circular travel path;

moving parts cassettes respectively accommodating different types of electronic components each to a component feeding position in a desired component mounting order such that a particular type of component of said electronic components can be picked-up by a particular component suction nozzle of said component suction nozzles which is located at a component pick-up position above said component feeding position;

picking up the particular type of electronic component from the component feeding position by said particular component suction nozzle;

moving the particular type of electronic component to a posture recognizing position;

detecting a posture of the particular type of electronic component held by the particular component suction nozzle at the posture recognizing position;

obtaining data on an amount of displacement of the particular type of component from a prescribed holding position of the component suction nozzle corresponding to each of the parts cassettes based on posture recognition results *corresponding to X- and Y-axes* detected at the posture recognizing position during said step of detecting;

adjusting the component feeding position of a subsequently fed and picked-up electronic component *by moving the component suction nozzle in at least one of X- and Y-directions defined by the X- and Y-axes, respectively* to more accurately correspond to the component pick-up position based on said data on an amount of displacement;

moving the subsequently fed and [nicked-up] *picked-up* electronic component to a component mounting position; and mounting the subsequently fed and picked-up electronic component on the circuit substrate at said component mounting position.

6. The method according to claim 5, further comprising storing the data on the amount of displacement of the particular type of component from the prescribed holding position of the component suction nozzle.

7. The method according to claim 5, further comprising:

accommodating each of the different types of said electronic components in respective parts cassettes;

repeating said method for each of the different types of said electronic components; and separately storing the data on the amount of displacement of the particular type of component measured each time the method is repeated.

8. The method according to claim 7, further comprising determining whether a deviation between the component pick-up and the component feeding position for each of the different types of said electronic components, based upon said data on the amount of displacement, is limited to less than all types of said different types of electronic components.

9. The method according to claim 8, wherein said step of adjusting includes individually adjusting a position of said parts cassettes when it is determined in said step of determining that less than all types of said different types of electronic components show said deviation.

10. The method according to claim 8, wherein:

said step of moving parts cassettes includes operating a component feeding unit into which a group of the parts cassettes is loaded; and said step of adjusting includes adjusting at least one of a position of the component feeding unit and a placing position of an entirety of the group of the parts cassettes onto the component feeding unit when it is determined in said step of determining that all types of said different types of electronic components show said deviation.

11. The method according to claim 5, wherein said step of adjusting includes manual adjustment at a time when it is determined that said amount of displacement of the particular type of component is beyond a permissible range.

12. The method according to claim 5, wherein said step of adjusting includes operating a drive mechanism which implements said adjusting of the component feeding position.

*13. A method of mounting an electronic component on a circuit substrate, comprising:*

*picking up an electronic component by a plurality of component suction nozzles having a pick-up position for picking up the component from a component feeding unit at a feeding position of the component feeding unit;*

*determining a posture of the component picked up by the component suction nozzle, wherein the determining of the posture of the picked-up component comprises determining an amount of displacement between the component suction nozzle and the picked-up component; and*

*adjusting the pick-up position and the feeding position relative to each other in at least one of X- and Y-directions corresponding to the X- and Y-axes, respectively, based on said determined posture of the picked-up component.*

*14. A method of mounting an electronic component on a circuit substrate, comprising:*

*picking up an electronic component by a plurality of component suction nozzles having a pick-up position for picking up the component from a component feeding unit at a feeding position of the component feeding unit;*

*determining a posture, with respect to X- and Y-axes, of the component picked up by the component suction nozzle, wherein the determining of the posture of the picked-up component comprises determining an amount of displacement between the component suction nozzle and the picked-up component; and*

*adjusting the pick-up position and the feeding position relative to each other in at least one of X- and Y-directions corresponding to the X- and Y-axes, respectively, based on said determined posture of the picked-up component, wherein the adjusting of the pick-up position and the feeding position relative to each other comprises adjusting the feeding position based on the amount of the displacement.*

*15. The method of mounting an electronic component according to claim 13, wherein the adjusting of the pick-up position and the feeding position relative to each other comprises adjusting the feeding position to correspond to the pick-up position.*

*16. The method of mounting an electronic component according to claim 13, wherein the adjusting the pick-up position and the feeding position relative to each other comprises moving the component suction nozzle in the X- and Y-directions.*

*17. The method of mounting an electronic component according to claim 13, wherein the adjusting the pick-up position and the feeding position relative to each other comprises moving the component suction nozzle thereby to adjust the pick-up position.*

*18. The method of mounting an electronic component according to claim 13, wherein the adjusting the pick-up position and the feeding position relative to each other comprises moving the component suction nozzle in the X- and Y-directions thereby to adjust the pick-up position.*

*19. A method of mounting an electronic component in which a plurality of parts cassettes respectively accommodating different types of electronic components are moved by a component feeding unit to a component feeding position in a mounting order for feeding electronic components, and a plurality of component suction nozzles are successively moved along a circular track from a component pick-up position above the component feeding position, where the component suction nozzle picks up the electronic component, to a posture recognizing position, where the posture of the electronic component held with the component suction nozzle is detected, and further to a component mounting position, where the picked-up electronic component is mounted on a circuit substrate, comprising:*

*obtaining data on an amount of displacement of the component from a prescribed holding position of the component suction nozzle corresponding to each of the parts cassettes based on posture recognition results corresponding to X- and Y-axes detected at the posture recognizing position; and*

*adjusting the component pick-up position and the component feeding position relative to each other of a subsequently-fed electronic component by moving the component suction nozzle in at least one of X- and Y-directions defined by the X- and Y-axes, respectively, to more accurately correspond to the component pick-up position based on said data on the amount of displacement.*

*20. A method of mounting an electronic component on a circuit substrate, comprising:*

*providing component suction nozzles successively movable along a circular travel path;*

*moving parts cassettes respectively accommodating different types of electronic components each to a component feeding position in a desired component mounting order such that a particular type of component of said electronic components can be picked-up by a particular component suction nozzle of said component suction nozzles which is located at a component pick-up position above said component feeding position;*

*picking up the particular type of electronic component from the component feeding position by said particular component suction nozzle;*

*moving the particular type of electronic component to a posture recognizing position;*

*detecting a posture of the particular type of electronic component held by the particular component suction nozzle at the posture recognizing position;*

*obtaining data on an amount of displacement of the particular type of component from a prescribed holding position of the component suction nozzle corresponding to each of the parts cassettes based on posture recognition results corresponding to X- and Y-axes detected at the posture recognizing position during said step of detecting;*

*adjusting the component pick-up position and the component feeding position relative to each other of a subsequently fed and picked-up electronic component by moving the component suction nozzle in at least one of X- and Y-directions defined by the X- and Y-axes, respectively, to more accurately correspond to the component pick-up position based on said data on an amount of displacement;*

*moving the subsequently fed and picked-up electronic component to a component mounting position; and*

*mounting the subsequently fed and picked-up electronic component on the circuit substrate at said component mounting position.*

* * * * *